(12) United States Patent
Liu et al.

(10) Patent No.: US 8,274,283 B2
(45) Date of Patent: Sep. 25, 2012

(54) METHOD AND APPARATUS FOR DIFFUSION TENSOR MAGNETIC RESONANCE IMAGING

(75) Inventors: Kecheng Liu, Solon, OH (US); YongMing Dai, Shanghai (CN); Tiejun Zhao, Wexford, PA (US); Thorsten Feiweier, Poxdorf (DE); Jing An, ShenZhen (CN)

(73) Assignee: Siemens Aktiengesellschaft, Munich (DE)

( * ) Notice: Subject to any disclaimer, the term of this patent is extended or adjusted under 35 U.S.C. 154(b) by 450 days.

(21) Appl. No.: 12/430,546

(22) Filed: Apr. 27, 2009

(65) Prior Publication Data

US 2010/0271021 A1 Oct. 28, 2010

(51) Int. Cl.
*G01V 3/00* (2006.01)

(52) U.S. Cl. ........................ 324/309; 324/307

(58) Field of Classification Search .......... 324/300–322; 600/407, 410, 419–422
See application file for complete search history.

(56) References Cited

U.S. PATENT DOCUMENTS

| | | | |
|---|---|---|---|
| 5,539,310 A | 7/1996 | Basser et al. | |
| 5,825,184 A | 10/1998 | Gullapalli et al. | |
| 5,969,524 A * | 10/1999 | Pierpaoli et al. | 324/307 |
| 6,445,184 B1 | 9/2002 | Tanttu | |
| 6,463,315 B1 | 10/2002 | Klingberg et al. | |
| 6,636,038 B1 | 10/2003 | Heid | |
| 7,034,531 B1 * | 4/2006 | Tuch et al. | 324/309 |
| 7,078,897 B2 | 7/2006 | Yablonskiy et al. | |
| 7,098,662 B2 * | 8/2006 | Hinks et al. | 324/318 |
| 7,358,730 B2 | 4/2008 | Mistretta et al. | |
| 7,443,166 B2 | 10/2008 | Heid | |
| 7,834,627 B2 * | 11/2010 | Sakai et al. | 324/318 |
| 2001/0027262 A1 | 10/2001 | Mistretta et al. | |
| 2005/0007100 A1 | 1/2005 | Basser et al. | |
| 2006/0173277 A1 | 8/2006 | Elgort et al. | |
| 2010/0016706 A1 * | 1/2010 | Wohlgemuth | 600/410 |
| 2010/0329528 A1 * | 12/2010 | Hajnal et al. | 382/131 |
| 2011/0012599 A1 * | 1/2011 | Gao et al. | 324/318 |
| 2011/0254548 A1 * | 10/2011 | Setsompop et al. | 324/309 |

OTHER PUBLICATIONS

Korosec F.R. et al., "Time-Resolved Contrast-Enhanced 3D MR Angiography," Magnetic Resonance Medicine 36 (1996): pp. 345-351.

Boada F.E. et al., "Spectrally Weighted Twisted Projection Imaging: Reducing $T_2$ Signal Attenuation Effects in Fast Three-Dimensional Sodium Imaging," Magnetic Resonance Medicine 38 (1997): pp. 1022-1028.

Jeong E.K. et al., "Reduction of Flow-Related Signal Loss in Flow-Compensated 3D TOF MR Angiography, Using Variable Echo Time (3D TOF-VTE)," Magnetic Resonance Medicine 48 (2002): pp. 667-676.

Assaf, Y., et al., "High $b$-Value $q$-Space Analyzed Diffusion-Weighted MRI: Application to Multiple Sclerosis," Magnetic Resonance in Medicine 47:115-126 (2002), ©2002 Wiley-Liss, Inc.

(Continued)

*Primary Examiner* — Brij Shrivastav
(74) *Attorney, Agent, or Firm* — Lempia Summerfield Katz LLC (57) ABSTRACT

An apparatus and method for obtaining diffusion weighted magnetic resonance images (DW-MRI) is described. The properties of the diffusion tensor in tissue are measured by applying a diffusion weighting gradient oriented along a plurality of measurement axes. The value of the magnetic field is increased by using as many of the magnetic gradient coils as are effective in contributing the gradient field strength along the axis being. In regions where the magnetic field gradient is increased, the echo time (TE) may be decreased, increasing the signal-to-noise ratio of the measurements. Alternatively, the number of measurements than are averaged to achieve a particular image quality may be decreased, reducing the patient exposure time.

23 Claims, 3 Drawing Sheets

OTHER PUBLICATIONS

Carroll, T.J., et al., "Carotid Bifurcation: Evaluation of Time-resolved Three-dimensional Contrast-enhanced MR Angiography," Radiology, Aug. 2001, vol. 220, No. 2, pp. 525-532.

Fukuyama, H., "Diffusion MRI principles and its application," Human Brain Research Center, Kyoto University Graduate School of Medicine, 24 pages (date unknown (after 2005), downloaded from www.nifs.ac.jp/itc/itc16/contents/material/1-1-Fukuyama.pdf).

Hasan, K.M., et al., "Comparison of Gradient Encoding Schemes for Diffusion-Tensor MRI," Journal of Magnetic Resonance Imaging 13:769-780 (2001), ©2001 Wiley-Liss, Inc.

Jones, D.K., "The Effect of Gradient Sampling Schemes on Measures Derived From Diffusion Tensor MRI: A Monte Carlo Study," Magnetic Resonance in Medicine 51:807-815 (2004), 2004 Wiley-Liss, Inc.

Le Bihan, D., et al., "Diffusion Tensor Imaging: Concepts and Applications," Journal of Magnetic Resonance Imaging 13:534-546 (2001), ©2001 Wiley-Liss, Inc.

Lori, N.F., "Magnetic Resonance Imaging," IBILI, Faculty of Medicine, Coimbra University, 40 pages (source and date unknown).

Meca, C.C., et al., "Diffusion MRI at large $b$ values: what's the limit?," Proc. Intl. Soc. Mag. Reson. Med. 11 (2004) 1 page.

Poonawalla, A.H., et al., "Optimization of B-Value and Gradient Orientation for Diffusion Tensor MRI," Department of Diagnostic Radiology, The University of Texas M.D. Anderson Cancer Center, Houston, TX, USA, 1 page, (2006).

Siemens, "MAGNETOM Maestro Class Diffusion Weighted MRI of the Brain," Siemens Medical, Printed in Germany, www.SiemensMedical.com, 6 pages, (2005).

Stejskal E.O., et al., "Spin Diffusion Measurements: Spin Echoes in the Presence of a Time-Dependent Field Gradient," The Journal of Chemical Physics, vol. 42, No. 1, Jan. 1, 1965, pp. 288-292.

Tijssen, R.H.N., et al., "Assessing and Minimizing the Effects of Noise and Motion in Clinical DTU at 3 T," Human Brain Mapping (2009), ©2008 Wiley-Liss, Inc., published online in Wiley InterScience (www.interscience.wiley.com), pp. 1-15.

Wu., W., et al., "Multi-component decaying behavior on high-b-value diffusion-weighted MRI," 2001 Proceedings of the $23^{rd}$ Annual EMBS International Conference, Oct. 25-28, Istanbul, Turkey, pp. 2286-2288.

Zhan, W., "Neuronal Connectivity Imaging with Diffusion MRI," Medical Imaging Informatics, Feb. 12, 2008, 37 pages.

\* cited by examiner

METHOD AND APPARATUS FOR DIFFUSION TENSOR MAGNETIC RESONANCE IMAGING

TECHNICAL FIELD

The present application relates to a method and system for obtaining diffusion-weighted magnetic resonance images.

BACKGROUND

Magnetic resonance imaging (MRI) uses the nuclear magnetic resonance (NMR) phenomenon to produce images. When a substance such as human tissue is subjected to a uniform magnetic field (polarizing field $B_0$), the individual magnetic moments of the spins in the tissue attempt to align with this polarizing field. If the substance, or tissue, is subjected to a magnetic field (excitation field $B_1$) which is in the x-y plane and which is near the Larmor frequency, the net aligned moment, $M_z$, may be rotated, or "tipped", into the x-y plane to produce a net transverse magnetic moment $M_t$. This excitation pulse is a radio frequency (RF) signal. A corresponding radio-frequency signal is emitted by the excited spins, and after the RF excitation signal $B_1$ is terminated, this emitted signal may be received and processed to form an image.

When utilizing these signals to produce images, magnetic field gradients ($G_x$ $G_y$ and $G_z$) are employed. The fields may be applied in a programmed sequence of pulses of varying amplitude, phase, duration and relative timing with respect to each other and to RF excitation pulses. This is often called a pulse sequence. Typically, the region to be imaged is scanned by a sequence of measurement cycles in which these gradients vary according to the particular localization method being used. Each measurement is referred to in the art as a "view" and the number of views determines the quality of the image. The resulting set of received NMR signals, or views, or k-space samples, are digitized and processed to reconstruct the image using one of many well known reconstruction techniques. The total scan time is determined in part by the length of each measurement cycle, or pulse sequence, and in part by the number of measurement cycles, or views, that are acquired for an image. There are many clinical applications where total scan time for an image of prescribed resolution and SNR is at a premium.

MR imaging of matter is based on the observation of the relaxation of the spins as measured by the amplitude of the emitted pulse that takes place after the RF pulse has stopped. The return of the excited nuclei from the high energy to the low energy state is associated with the loss of energy to the surrounding nuclei. Macroscopically, this spin-lattice or T1 relaxation is characterized by the return of the longitudinal net magnetization vector to a maximum length in the direction of the magnetic field. This return is an exponential process of the form of $1-e^{-t/T1}$. The T1 relaxation time is the time constant of this exponential: i.e. the time needed for the longitudinal magnetization to return to $(1-1/e)$ of the original value.

Microscopically, T2 relaxation, or spin-spin relaxation, occurs when the spins in the high and low energy state exchange energy but do not loose energy to the surrounding lattice. Macroscopically, this results in a loss of transverse magnetization. T2 relaxation is also an exponential process, in the form of $e^{-t/T2}$, and the T2 time is the time needed for the transverse magnetization to decay to 1/e of the original value.

In pure water, the T2 and T1 times are approximately identical. For biological material, the T2 time is considerably shorter than the T1 time.

By varying imaging parameters such as TR (repetition time of the RF pulse) and TE (echo time interval of a spin-echo sequence), it is possible to weight the signal emitted by the tissue being imaged to produce T1-, T2- or PD-weighted (proton density) images. From a medical perspective, this means that MR imaging can provide multiple image contrasts, emphasizing different tissue features so as to observe the same anatomy. White matter would appear in a light grey in a T1-weighted image and a dark grey in a T2-weighted image. Grey matter would appear grey in both images. The cerebrospinal fluid (CSF) would appear as black in a T1 weighted image and white in a T2 weighted image. The background of the image (air) would appear as black in both images.

The echo time, TE, is the time from the first excitation RF pulse to the center of the echo (signal) being received. Where a spin-echo pulse sequence is used, the TE is the time interval between data measurements associated with the refocusing pulses and is much shorter than T2. Shorter echo times allow less T2 signal decay. The Repetition time, TR, is the time between RF pulses (not including the refocusing pulses). Short TR values do not allow the spins to recover their longitudinal magnetization, so the net magnetization available would be reduced, depending on the value of T1. A short TE and long TR give strong signals.

Diffusion Tensor MRI (DT-MRI) is a magnetic resonance (MR) imaging modality which is capable of non-invasively measuring the bulk diffusive motion of water in biological systems. These images are often called Diffusion Weighted (DW) images so as to differentiate the data from data taken with, for example, conventional T1 or T2 weighting.

The diffusion coefficient D (i.e. random motion of molecules in tissue) is larger in directions along structures in tissues (e.g. along nerve tracts or along muscle) than in directions perpendicular to the structures. That is, the diffusion could be anisotropic.

The diffusion coefficient may be mathematically characterized as a 3×3 second-rank tensor matrix. In diffusion tensor imaging, the diffusion properties of water are measured in a laboratory frame of reference, for example, using the spatial coordinates x, y, and z (where z is the axis along the main magnetic field $B_0$ of the MR device). The tensor matrix has nine non-zero elements, of which three are the same (symmetric tensor). The remaining six elements ($D_{xx}$, $D_{yy}$, $D_{zz}$, $D_{xy}$, $D_{xz}$, and $D_{yz}$) for each voxel may be calculated from a minimum of six images which may be obtained by applying diffusion-sensitizing gradients in at least six non-colinear directions (for example: xx, yy, zz, xy, xz, and yz) in addition to a nondiffusion-weighted image. A property of second-rank tensors is that they can be diagonalized, leaving only three nonzero elements along the main diagonal of the tensor: the eigenvalues ($\lambda_1, \lambda_2, \lambda_3$). The eigenvalues reflect the shape or configuration of the ellipsoid. The relationship between the principal coordinates of the ellipsoid represented by the diffusion tensor and the laboratory frame is described by the eigenvectors ($v_1, v_2, v_3$).

In practice, the orientation of the gradient axes, which are determined by the physical architecture of the MRI device, are in a Cartesian reference frame (x, y, x), whereas the orientation of the tissue with respect to the reference frame is not generally known a priori.

When measurement noise, patient movement and equipment limitations are taken into account, a larger number of axial directions may be used to accumulate the measurement data. Between N=6 and at least 256 independent axes are known to have been used or theoretically evaluated. The use of a large number of measurement axes is often termed High Angular Resolution Diffusion Imaging (HARDI).

During random diffusion, the displacements of the molecules may serve to probe tissue structure on a microscopic scale; this resolution is well beyond the usual image volumetric resolution. During a typical diffusion time of about 50 ms, a water molecule, for example, may move an average distance of about 10 μm, interacting with many tissue components such as nerve fibers, cell membranes and the like. Thus, the overall effect observed in a DW MRI image of a voxel, which may be several mm³, may represent the statistical diffusion behavior of the water molecules within the voxel.

In particular, voxels containing neuron bundles exhibit significant anisotropies in the diffusion tensor, with the high-diffusion eigenvector being observed to be aligned with the nerve fiber bundle. The measured diffusion tensor may be used to define the local principal axis of a neuron or neuron bundle and then used to enable the identification of the orientation of nerve bundles with respect to each other and to other structures of the brain.

Fiber tracking simplifies the diffusion tensor field to the vector field of the main eigenvector. Conceptually, considering this vector field as a velocity field and dropping a free particle on it, this particle will follow a trajectory constrained by the velocity field. The resultant trajectory may be considered as representing a bundle of nerve fibers in the brain or muscle fibers. Fiber tracking shows global information about, for example, the connections between portions of the brain by neural tissue, and the orientation of these connections with respect to the surrounding organs and structures.

The diffusion data are determined in a magnetic resonance measurement as related to the magnitude and direction of the diffusion gradient fields used for diffusion coding. In an implementation, strong magnetic gradient pulses G are applied time-symmetrically about a 180° radio-frequency refocusing pulse in a spin-echo pulse sequence. The first gradient pulse, applied before the 180° refocusing pulse generates, a phase shift for all spins; and, the second gradient pulse, applied after the refocusing pulse, inverts the phase shift. Where the molecules are stationary during this time period, the phase shifts cancel. The water molecules may move due to Brownian motion, and their motion may be constrained by the tissues. For the molecules that, due to this diffusion, are located at a different location during the second gradient pulse from where they were located during the first gradient pulse, the phase shift may not be completely compensated. This leads to a reduction in amplitude of the magnetic resonance signal from the voxel, and the signal amplitude thus depends on the diffusion tensor (DT) of the voxel.

The diffusion weighting (DW) gradients are applied independently of the gradients used to encode the image data for acquisition of slice of MRI data. The degree of diffusion weighting is described by a parameter known as the "b value" or "b," that is determined by the properties of the diffusion-sensitizing gradient scheme. For the Stejskal-Tanner spin-echo scheme (see, "Spin Echoes in the Presence of a Time-Dependent Field Gradient" by E. O. Stejskal and J. E. Tanner J. Chem. Phys. 42, 288 (1965)), for a pulsed pair of approximately rectangular gradients symmetrically disposed around a 180° radiofrequency pulse, the b value is determined by the duration (δ) and strength (G) of the sensitizing pulsed magnetic gradients, and the time interval between the two pulsed gradients (Δ) according to:

$$b \text{ value} = \gamma^2 G^2 \delta(\Delta - \delta/3) \quad (1)$$

where γ is the gyromagnetic ratio. Thus, the b-value (diffusion sensitization) can be increased by using stronger G and longer δ pulsed gradients, or by lengthening the time Δ. A typical value for b in human measurements is 500-2000 s (seconds)/mm², but values in the range of about 0 to about 10,000 s/mm² may be used. The signal intensity (S) in every voxel of a diffusion-weighted MR image is influenced by the choice of b value and pulse sequences and imaging parameters such as TE, and tissue specific apparent diffusion coefficient $\underline{D}$, a coefficient that reflects molecular diffusivity in the presence of restrictions, such as viscosity and spatial barriers; and spin-spin relaxation time (T2).

$$S = S_0 \exp(-b\underline{D}) \quad (2)$$

where $S_0$ is the signal intensity at a b value of 0.

Acquiring diffusion-weighted images with at least two different b values (for example, approximately 0 and 1000 s/mm²) while keeping the TE fixed allows the determination of the tensor D for each image voxel. Assigning a gray scale to the range of $\overline{D}$ values in the different voxels comprises a $\overline{D}$ map. The map provides contrast based purely on differences in diffusivity of water in biologic tissue that is not distorted by differences in T2 relaxation times.

DT-MRI may be used to study neuro-connectivity and neuron fibers for clinical diagnosis as well as for pre-surgery planning. For currently used diffusion tensor models a high b-value may be needed to identify and distinguish areas of fiber crossings. However, a short echo time TE is desirable so as to maximize the signal-to-noise ratio (SNR) as well as to detect tissues with shorter values of T2, such as muscle.

In practice, the gradient coil and gradient-coil-power amplifier sub-system of a MRI device has performance limits. As a consequence, a compromise between TE and the b-value is made in clinical practice. Where this is done, averaging of the signals for each voxel for a plurality of measurements may be needed to ensure a sufficient SNR to perform the subsequent analysis. This may result in an extended imaging time when High Resolution Radial Direction Imaging (HARDI) is performed.

One factor which may establish a lower bound on the value of TE may be the capability of the gradient power amplifier (GPA) of the MRI device when the diffusion gradient is aligned on one axis: e.g., xx, yy, or zz.

SUMMARY

A method of measuring a diffusion tensor is disclosed, including the steps of: selecting a set of axial directions for which diffusion weighted magnetic resonance image (DW-MRI) data are desired; grouping the axes spatially into at least three groups; and selecting at least one of the echo image time (TE) or the gradient b-value to be a different value in each group. An MRI device is operated using the selected axes and operating values to obtain DW-MRI data.

A magnetic resonance imaging (MRI) device is disclosed including a main magnetic field coil; three gradient magnetic field coils; a radio-frequency (RF) transmit-receive unit; and a control computer. The control computer is configured to operate the MRI device to collect data for measuring a diffusion tensor of a voxel by measuring T2-weighted images with a diffusion gradient applied along a plurality of axial measurement directions. The measurement axial directions are assigned to three groups and at least one of a b-value or a value of echo image time (TE) is varied from group-to-group.

A first computer program product, stored on a computer readable media, includes instructions for configuring a computer associated with a magnetic resonance imaging device to obtain diffusion a diffusion-weighted magnetic resonance image (DW-MRI) data for a voxel along a set of axial directions. The axial directions are spatially segmented into at least three groups; and at least a value one of the echo image time (TE) or the b-value is a different value in each group.

A second computer program product, stored on a computer readable media, includes instructions for configuring a computer to select an orientation of M axial directions that are substantially uniform in angular space; form R groups of axial directions, where members of each group have a similarity of orientation relationship to three orthogonal axes, where R is at least 3. Information characterizing the gradient amplifier and coil properties of a magnetic resonance imaging (MRI) device, the T2 value of tissue to be imaged, and a signal-to-noise ratio to be achieved are used to compute a combination of a T2 value, b-value and number of measurements N for each group of the R groups, so that the total number of measurements is reduced when compared with a constant value of T2 and the b-value. The results are stored in the computer or transmitted to another computer for controlling the operation of a MRI device.

DETAILED DESCRIPTION

Exemplary embodiments may be better understood with reference to the drawings. In the interest of clarity, not all the routine features of the implementations described herein are described. It will of course be appreciated that in the development of any such actual implementation, numerous implementation-specific decisions must be made to achieve a developers' specific goals, such as compliance with system and business related constraints, and that these goals will vary from one implementation to another.

Figure 1:
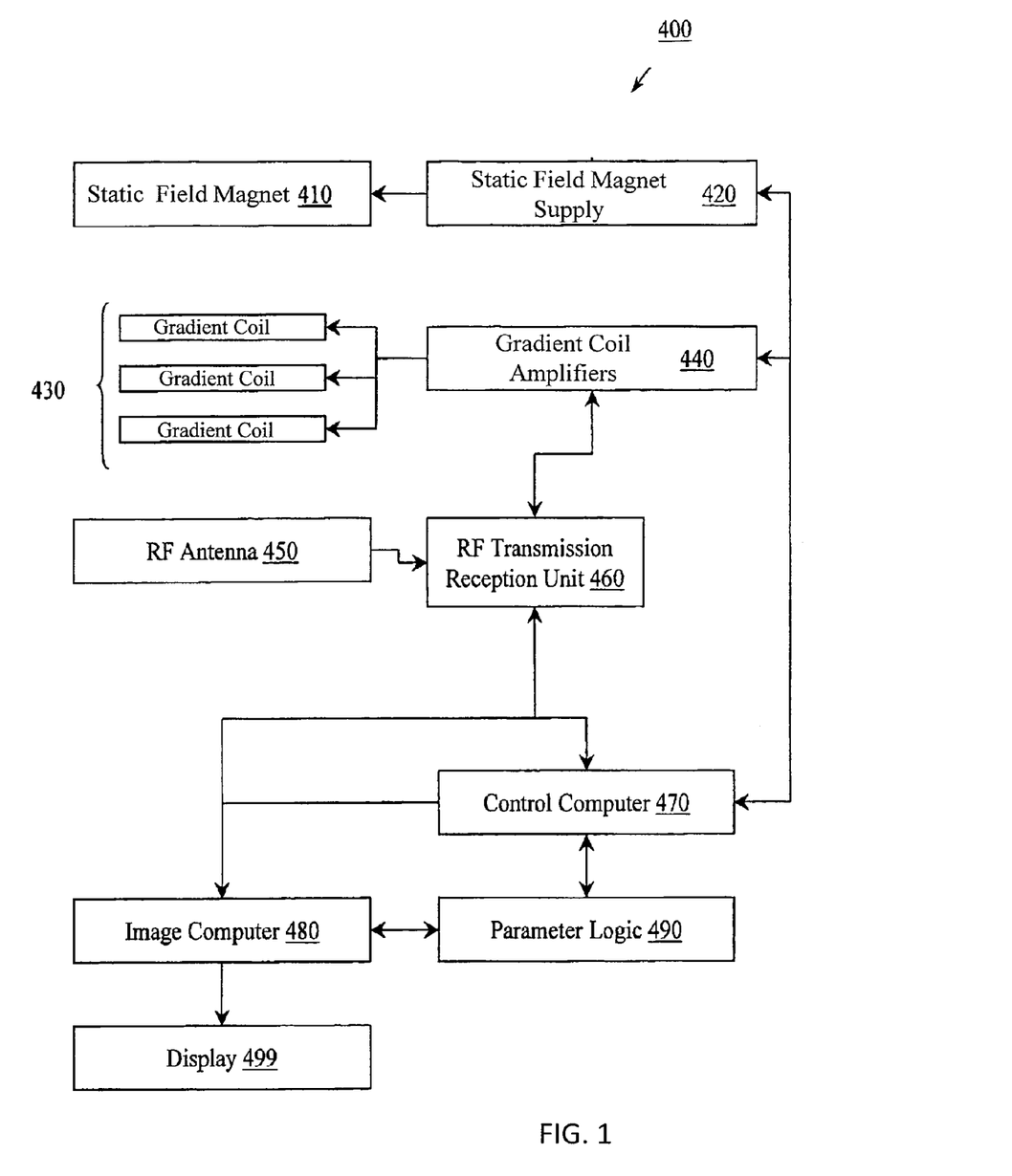
FIG. 1 is a block diagram of an example of a magnetic resonance imaging (MRI) system.

FIG. 1 illustrates an example MRI apparatus 400 including a static field magnet 410 and a static field magnet supply 420. Ideally, the static field magnet 410 would produce a uniform $B_0$ field. The MRI apparatus 400 may also include gradient coils 430 configured to emit gradient magnetic fields Gx, Gy and Gz, which may be oriented in the laboratory, or device, frame such that the z direction is the direction of the static field $B_0$. The gradient coils 430 may be controlled, at least in part, by a gradient coil amplifier 440. The timing, strength, and orientation of the gradient resultant magnetic fields may be controlled during an MRI procedure.

The MRI apparatus 400 may also include an RF antenna 450 that is configured to generate RF pulses and to receive resulting magnetic resonance signals from an object to which the RF pulses are directed. In an aspect, separate RF transmission and reception coils can be employed, and a plurality of transmission and reception coils may be used as well. The RF antenna 450 may be controlled, at least in part, by an RF transmission-reception unit 460. The gradient coil amplifier 440 and the RF transmission-reception unit 460 may be controlled, at least in part, by a control computer 470. The control computer 470 may be programmed to perform methods such as methods those described herein.

The magnetic resonance signals received from the RF antenna 450 may be employed to generate an image, and thus may be subject to a transformation process such as a two dimensional FFT to generate pixilated image data representing voxels in an image slice. The transformation can be performed by an image computer 480 or other similar processing device. The image computer 480 may be programmed to perform the methods described herein using parameter logic 490, which may be stored in any of the computers or in non-volatile media (not shown). The image data may be processed so that the diffusion tensor for each voxel in a region of interest may be determined, and additional image analysis such as fiber tracking performed. The images or processed data may then be shown on a display 499.

Measuring the diffusion tensor $\overline{D}$ is performed by obtaining diffusion weighted voxel data. Each voxel is measured after being subject to diffusion gradients, where the diffusion gradients are applied along spatial axes of measurement. The number and orientation of the spatial axes depends on the objectives of the imaging study. This may include considerations such as whether the subject is a human or an animal, and the use to which the diffusion tensor data will be put, such as fiber tracking or stroke assessment or the like. While at least 6 independent axial data sets using diffusion gradients are required, with the addition of a single data set without a diffusion gradient, there are situations where more axes are used, such as in HARDI. The various schemes are called diffusion gradient encoding.

A variety of approaches have been explored to select the encoding axes: heuristic; numerically optimized; and, geometric polyhedra. The heuristic encoding schemes select axial directions based on the properties of a cube, including off-axial directions. For a larger number of axes, such as is used in HARDI, the selection of axes is numerically optimized or selected using geometric polyhedra. The numerical encoding schemes generally attempt to distribute the axes uniformly on the surface of a unit sphere of gradient amplitudes (constant b); and the geometric polyhedra encoding schemes typically use one of the regular icosahedron polyhedra family. The axial directions of these schemes are generally selected so that the distribution of angular directions is substantially uniform in angular space. However, other axial direction distribution schemes may be used.

Except where an axis selected of set of axes in the gradient encoding scheme coincides with the principal axes of the MRI apparatus (that is Gx, Gy, or Gz), a combination of more than one gradient coil 430 may be used to generate the encoding magnetic field along the measurement axis as a vector superposition of the individual coil magnetic fields. The magnetic fields for remaining measurement axes are generated by a combination of gradient amplifiers and coils.

In conventional diffusion gradient imaging, the maximum magnetic field output of gradient coils 430 is the maximum output along a single axis. Thus, to maintain the value of b as a constant over the ensemble of diffusion gradient axes, the amplitude of the magnetic field produced by the gradient field amplifier 440 is controlled so that the vector sum of the magnetic fields is a constant, regardless of orientation angle.

For no diffusion weighting (b=0), the maximum signal to noise ratio for white matter in the brain is achieved when the TE is shortest, due to the exponential decay of echo signal strength which is proportional to the ratio of TE/T2. The signal-to-noise ratio (SNR) is also proportional to the static magnetic field strength $B_o$. Maximizing the SNR each individual measurement is desirable so as to obtain the voxel data in the shortest overall patient exposure time. However, when diffusion weighting is applied, the length of the diffusion gradient pulses and the spacing therebetween then places a lower bound on the value of TE that may be used.

Since the vector sum of the magnetic field outputs of the gradient coils 430 is maintained a constant, the b-value will remain a constant at any spatial orientation if the pulse duration δ and inter-pulse interval Δ are also constant. The minimum value of TE depends on the pulse amplitude, duration and inter-pulse interval, so the value of TE used is independent of the spatial orientation of the measurement axis. The value of the individual axial gradient fields is adjusted to achieve this result.

A gradient sampling scheme where two of the gradient amplifiers are combined to yield the maximum composite gradient amplitude has been used; that is, the maximum gradient field on each axis is used, resulting in a larger composite magnetic field at a 45 degree angle to each axis, in the plane containing any two gradient coil axes. However, the spatial orientation of these higher-field-strength regions is not well distributed over the ensemble of gradient measurement angles of the unit sphere high-resolution schemes, and there is a likelihood of a directional bias in the resultant measurements.

From equation (1), when the diffusion gradient field strength G is increased, other parameters such as the gradient duration may be decreased while yielding the same resultant value of b. When the gradient duration δ is decreased, the time interval TE between successive refocusing pulses may be decreased, and this results in a reduction in lower bound on TE. As the amplitude of the T2 signal is inversely proportional to $e^{-TE/T2}$, a significantly higher SNR may be achieved for the T2 signal. Alternatively, a larger value of b results in a stronger decrement of the T2 signal in the direction of greatest anisotropy, and this may be used effectively. The value of D is dependent on the value of b, and equation (1) may be used to adjust the measurements.

For a situation where a particular SNR is desired, the larger the SNR for each echo, the smaller the number of echoes that may need be averaged to achieve the target SNR. Where human subjects are concerned, this is helpful for several reasons. Human subjects cannot be fixed in place as securely as animal subjects, due to discomfort, claustrophobia and other similar problems. Moreover, while the MRI apparatus uses magnetic and radio frequency fields, which are non-ionizing radiations, there still exist norms for exposure to the electromagnetic fields for peak fields and duration of exposure. Some of these limits relate to radio-frequency-induced body heating, and some to physiological effects of high magnetic fields that are poorly understood at present.

In clinical practice, the shortest value of TE that is used is that which is based on the gradient maximum field strength which can be delivered along any one of the principal axes of the MRI machine. Signal averaging is then used to ensure a sufficient signal to noise for this case. This does not use the full capability of the gradient field amplifier 440, since all three of the gradient coils may be fully energized simultaneously. The gradient field amplitude using a single amplifier and coil is limited by equipment considerations to the maximum gradient that may be produced along any one of the principal axes of the MRI apparatus 400. The value of b desired for the measurement is achieved by selecting appropriate values of pulse amplitude, duration δ and duration Δ. This choice of parameters, effectively determines the time duration of the application of gradient and the minimum time between spin-echo sequence samples TE. The same value of TE is used throughout the measurement-axis sample space and, since b is also a constant, a single image at b=0, but with the same TE may be used as the data for normalization. The value of TE in clinical practice is determined therefore by the on-axis performance of the MRI coils 430 and amplifiers 440.

However, when considered over the spherical volume of diffusion space, the value magnetic field strength in certain directions, such as at an approximately 45 degree angle to each of the principal axes, will be larger as the vector sum of the individual x, y and z field strengths. The effect is greatest when all three of the amplifiers contribute to the resultant magnetic gradient field strength; an increase in field strength is also obtained at a 45 degree angle to two of the principal axes.

That is, in the direction of each of the principal gradient coil axes, the maximum field strength is a value $G_a$, where a=x, y, z. For an axis passing through the origin and disposed in the plane defined by two gradient coils, the maximum field strength is the vector sum of two axial fields, Ga, which is increased over that of a single axis by √2 when the axis is at a 45° angle to each of the two. For an axis passing through the origin and angularly equidistant from each of the axes, the maximum field strength is increased over that of a single axis by √3. Intermediate increases in field strength are obtained at other angular dispositions of the measurement axes with respect to the coil axes. This pattern is repeated in each quadrant of the angular space for an 8-way symmetrical pattern.

A standard of comparison is the current clinical approach for HARDI where the gradient sampling scheme includes a large number of gradient vectors (e.g., 60) and the intersection of the vectors with a unit sphere of magnetic field amplitude is approximately uniformly distributed. Alternatively the minimum number of independent axes, based on a cube, for example, may be used.

In contrast, consider the amplitude of the gradient magnetic field for a constant TE. As an approximation, a quadrant of angular space may be divided into, for example, three wedges: high total gradient field (Zone 3), medium total gradient field (Zone 2); and, low total gradient field (Zone 1). The Zone 1 volumes are oriented along the principal axes, x, y, z. of the MRI device; Zone 2 lies between the principal axes in a plane of pairs of axes (eg., xy, xy, yz); and Zone 3 is centered angularly equidistant from the three principal axes. Data may be collected from axial directions of the gradient axis sampling space selected in each of the zones separately, using differing parameters for the operation of the MRI apparatus.

For each Zone, the acquisition strategy may be optimized. Using a constant value of b in each of the angular zones, as the value of G is greater in Zone 2 than in Zone 1, the value of δ may be reduced due to a larger composite gradient amplitude in Zone 2 while maintaining b as a constant. Reducing the value of δ may also permits a shorter value of Δ. The reduction of a sum of the values of δ and Δ permits a shorter minimum TE, and a shorter TE increases the SNR of each signal return. A further reduction of TE is possible in Zone 3 as the maximum field strength is larger, e.g. factor of √3 larger.

For longer TE Zones, such as Zone 1, signal averaging is usually needed to achieve a sufficient SNR;
    for shorter TE Zones, such as Zone 2, the SNR is higher as TE is shorter, and either signal averaging is not needed, or less signal averaging than for Zone 1 is needed to achieve the same SNR; and,
    for the shortest TE Zones, such as Zone 3, the SNR is even higher, and signal averaging may not be needed to achieve a same SNR.

Experimental measurements, suggest that a 20 ms reduction in TE may result in a 40 percent increase in SNR. This would mean that if, in a worst case, two signal averages were needed, then in a best case no signal averaging may be needed.

When data sets are obtained with differing values of TE, the overall T2 weighting has also changed. However if a single non-diffusion-weighted data set is taken for each of the differing TE values, then the difference may be eliminated in the measurements of the zones when solving for the diffusion coefficient values.

In a first example of the method herein, shown in Table I, (constant b-value, varying TE). The voxel data in Zone 1 is obtained with the same parameters as the conventional case, and averaging is required to achieve the appropriate SNR. The number of pulses that are averaged in Zone 1 is shown in Table I, qualitatively, as N=4. This will be used as a basis of comparison with the remaining angular zones.

TABLE I

A first example of the method where the b-value is a constant.

| Zone | TE | N |
|---|---|---|
| 1 | longest | 4 |
| 2 | moderate | 2 |
| 3 | shortest | 1 |

In Zone 2, since the vector sum of the magnetic fields of a multiplicity of axial fields is greater than in Zone 1, b would increase, except that one or more of δ and Δ are reduced. Since sum of δ and Δ is the lower limit on TE, the value of TE for Zone 2 may be reduced. Reducing TE increases the SNR of the response signal, and the number of pulses that may need to be integrated to achieve the desired SNR may be reduced with respect to that of Zone 1. In Table X, the number of pulses that were integrated in Zone 1 was set to 4, and in Zone 2, the number of pulses needed is reduced. This is expressed qualitatively as N=2 pulses.

In Zone 3, the effectiveness of the summation of the principal axis fields in the direction of the measurement axis is highest. And, correspondingly, at least one of δ or Δ may be further reduced, with a concomitant reduction in TE with respect to the value used in Zone 2. Again, the reduction in TE results in a further increase in the SNR of the response signal, and a smaller number of pulses, in the limit 1, may need to be integrated. This is shown in the table qualitatively as N=1.

In summary: TE1>TE2>TE; b=constant; and, N1>N2>N3.

The conventional clinical approach of a constant TE and b-value for all measurements would limit the SNR per measurement to the same value as that of Zone 1 of the present example as the TE and b-value would have been determined by the maximum magnetic field strength along a principal axis. While a fewer number of axial directions may used in a conventional case where HARDI is not used, the resultant SNR must be substantially greater in each axis so as to achieve comparable accuracy to that of the present example. One may conceptualize this as equivalent to using the greater number of measurement axes of the present example, but retaining the measurement parameters of Zone 1.

So, in the conventional case, a total of 4 pulses needed to be integrated for each of the directional axes in Zone 1; a total of 4 in Zone 2; and, a total of 4 in Zone 1. This is a total of 12 pulses, plus one data set for the normalization (b=0), for a total of 13 time intervals. However using the first example of the method, shown in Table II, 4 pulses need to be integrated for each directional axis in Zone 1, 2 pulses need to be integrated in Zone 2, and 1 pulse needs to be integrated in Zone 3, as well as the b=0 data, for a total of 8 time intervals. This comparison has been further simplified so that the number of measurement axes in each of the three zones is the same. The actual distribution of measurement axes in each of the Zones is determined by computation of the relationship of the axial directions of a axial distribution scheme with respect to the principal axes of the MRI device, and typically, the number of measurement axes in each of the Zones would be a different number. The number of Zones may be two or more.

Table II shows a second example of the method. The value of TE is established so that voxel data taken for axial directions substantially coinciding with a MRI device magnetic gradient coil axis (Zone 1) may be obtained with the desired SNR without averaging. This may be achieved by, choosing δ and Δ so that the desired value of TE is obtained. In this situation, the values of δ and Δ may be such that b is less than the maximum value of b that may be achieved along the device axial orientations. The value of TE thus determined is maintained throughout the imaging process.

TABLE II

A second example of the method where TE = constant.

| Zone | b-value | N |
|---|---|---|
| 1 | smallest | 1 |
| 2 | moderate | 1 |
| 3 | largest | 1 |

Thus, in Zone 1, TE is the value such that the signal strength yields a suitable SNR without the need for integration: N=1.

In Zone 2, the same value of TE is used, which implies the same value for the combination δ and Δ in each of the laboratory axes. The summation of the magnetic fields in Zone 2 is more effective than in Zone 1, and the b-value is increased, and N remains equal to 1.

Similarly, in Zone 3, the value of TE remains the same, and the b-value is further increased with respect to Zone 2, as the summation of the fields is still more effective as all three axes contribute to the vector sum. N remains equal to 1. In this example, since TE has remained the same, only a single voxel data set is needed for the normalization, and the total number of time intervals is three with a b-value and 1 with b=0 for a total of 4.

In an aspect, the magnitudes of the magnetic fields excited by the gradient coils may be adjusted so that the b-value is substantially constant in each of the three angular zones.

In summary: TE1=TE2=TE3; b1<b2<b3; and, N1=N2=N3=1.

The number of data sets integrated in each zone is shown qualitatively, and depending on the imaging requirements, some global multiple of the number N may be selected to achieve a higher overall SNR.

The combination of hardware and software to accomplish the tasks described herein may be termed a platform or "therapy unit". The instructions for implementing processes of the platform may be provided on computer-readable storage media or memories, such as a cache, buffer, RAM, removable media, hard drive or other computer readable storage media. Computer readable storage media include various types of volatile and nonvolatile storage media. The functions, acts or tasks illustrated in the figure or described herein may be executed in response to one or more sets of instructions stored in or on computer readable storage media. The functions, acts or tasks may be independent of the particular type of instruction set, storage media, processor or processing strategy and may be performed by software, hardware, integrated circuits, firmware, micro code and the like, operating alone or in combination. Some aspects of the functions, acts, or tasks may be performed by dedicated hardware, or manually by an operator.

In an embodiment, the instructions may be stored on a removable media device for reading by local or remote systems. In other embodiments, the instructions may be stored in a remote location for transfer through a computer network, a local or wide area network, by wireless techniques, or over telephone lines. In yet other embodiments, the instructions are stored within a given computer, system, or device.

Where the term "data network", "web" or "Internet" is used, the intent is to describe an internetworking environment, including both local and wide area networks, where defined transmission protocols are used to facilitate communications between diverse, possibly geographically dispersed, entities. An example of such an environment is the world-wide-web (WWW) and the use of the TCP/IP data packet protocol, and the use of Ethernet or other known or later developed hardware and software protocols for some of the data paths.

Communications between the devices, systems and applications may be by the use of either wired or wireless connections. Wireless communication may include, audio, radio, lightwave or other technique not requiring a physical connection between a transmitting device and a corresponding receiving device.

While the communication is described as being from a transmitter to a receiver, this does not exclude the reverse path, and a wireless communications device may include both transmitting and receiving functions. There term "wireless communication" is understood to comprise the transmitting and receiving apparatus, including any antennas, and any modem used to encode or decode the data, speech, or the like, for transmission using electromagnetic waves.

A first computer program product includes instructions to configure a computer, which may be the control computer 470 of the MRI equipment 400, or another computer in communication with the control computer 470 or other control interface to the MRI equipment 400 so as to obtain diffusion-weighted MRI images of a patient. The instructions cause commands to be issued so as to vary at least one of the TE or b-value of the MRI equipment, depending on the angle of the diffusion measurement axis with respect to the gradient magnetic field coil axes of the MRI equipment 400. In an aspect, for each combination of TE and b-values, a number N of measurements for the voxel in the measured axial direction is selected such that when N measurements are averaged a desired signal-to-noise ratio is achieved, or that a total measurement time is reduced with respect to a constant b or constant TE measurement approach. In an aspect, a second computer program product includes instructions to configure a computer to accept parameters describing the gradient amplifier characteristics and the gradient coil characteristics of the MRI equipment 400, the value of T2 for the tissue to be imaged, and the number of axial directions for which diffusion-weighted MRI data for a voxel in a region of interest are to be obtained. The plurality of axes are oriented in angular space using one of a numerical method or, for example, the vertices of geometric polyhedra. The plurality of axes are formed into three or more groups in angular space such that axes with similar geometric orientations with respect to the magnetic coil axes of the MRI equipment. For each of the groups a value of TE and a b-value is computed so that the number of measurements that are needed to achieve a value of SNR is reduced, or a measurement time is reduced. A table of the axial directions and the associated b-values, TE and N is provided to the first computer program product.

Figure 2:
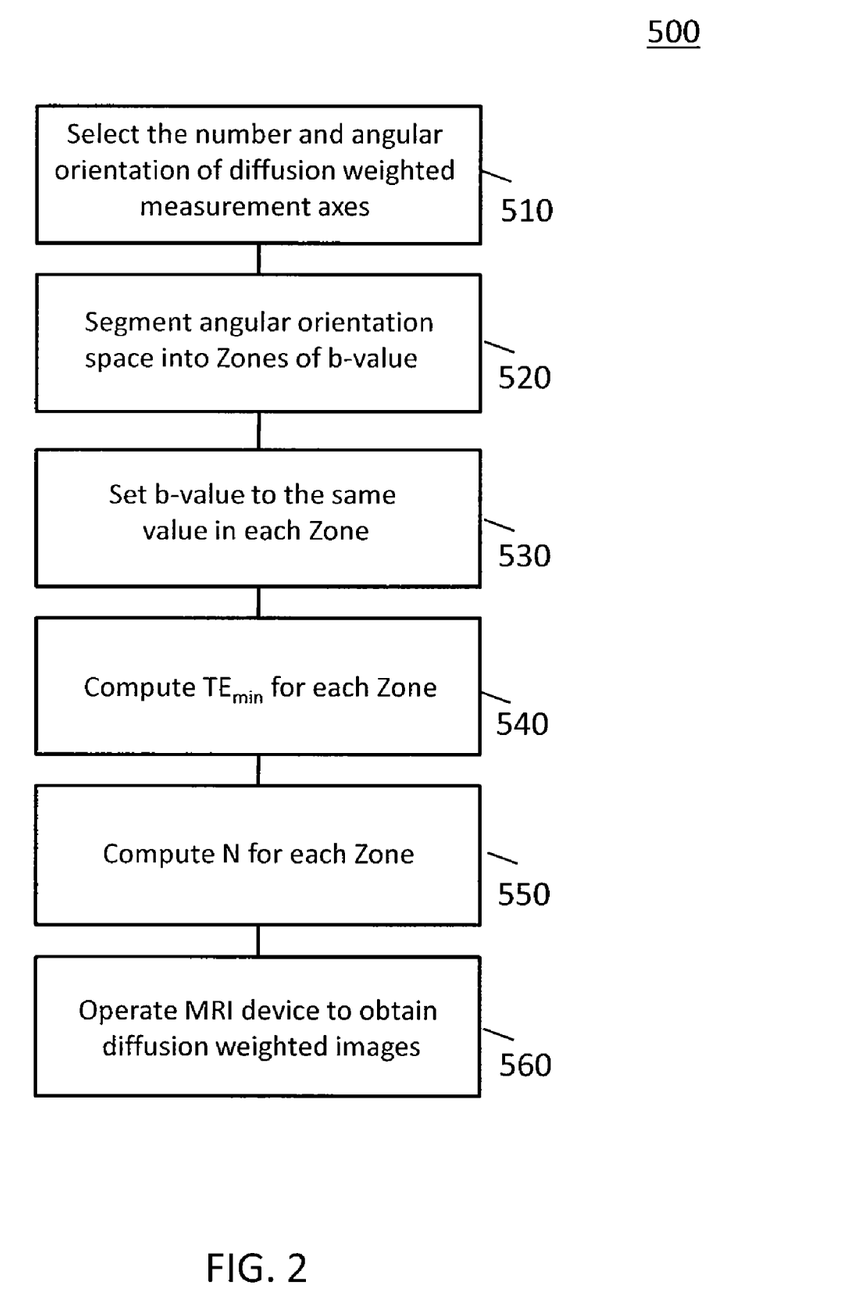
FIG. 2 is a flow chart of a first method of obtaining diffusion-weighted magnetic resonance images (DW-MRI) when three axial directions of gradient are energized simultaneously.

In an aspect, the MRI device of FIG. 1 may be operated as shown in FIG. 2 to collect DW-MRI image data (500) by performing the steps of: selecting a number and orientation of measurement axes for the diffusion weighted image data (step 510), and dividing the angular space into a plurality of zones (step 520) where the zones generally encompass angular orientations having a substantially same value of b. The value of b in each of the zones has a potential maximum value associated with the orientation of the zones with respect to the three gradient coil axes. One or more of the duration or the inter-pulse spacing of the diffusion gradient fields is adjusted so that the values of b are substantially the same in all of the zones (step 530). For each zone, a minimum value of TE is determined based on the selected duration and inter-pulse spacing (step 540), and this value of TE is used to obtain the diffusion weighted data for the axial directions within the zone. The number N of data sets to be obtained and averaged for each zone is determined based on the total number of axes R and the desired signal-to-noise ratio (SNR) (step 550). The steps 510-550 may be performed as a part of the planning of the data acquisition, on the basis of, for example, statistical studies of the noise influences on data interpretation, or on the type of tissue to be imaged. The results of the planning may be stored in non-volatile media for future use, or be used directly in controlling a MRI device 400 so as to obtain DW-MRI data (step 560).

Figure 3:
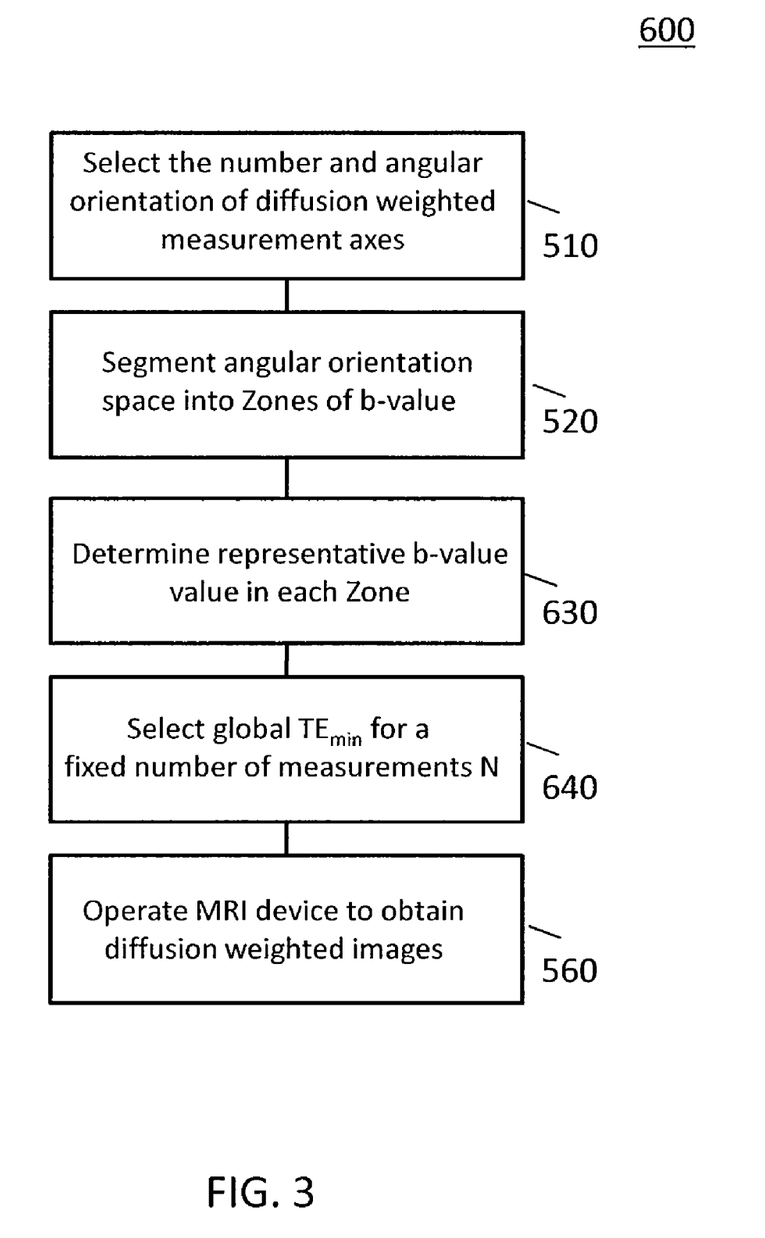
FIG. 3 is a flow chart of a second method of obtaining diffusion-weighted magnetic resonance images (DW-MRI) when three axial directions of gradient are energized simultaneously.

In another aspect (600), shown in FIG. 3, the steps of selecting a number and direction of measurement axes (step 510), dividing the angular space into a plurality of zones (step 520) are performed. A representative b-value for each of the zones is determined (630). A global value of TE is selected and the number N of data sets to be obtained and averaged for each zone is determined based on the total number of axes R and the desired signal-to-noise ratio (SNR) (step 640). The steps 510-520 and 630-640 may be performed as a part of the planning of the data acquisition, on the basis of, for example, statistical studies of the noise influences on data interpretation, or on the type of tissue to be imaged. The results of the planning may be stored in non-volatile media for future use, or be used directly in controlling a MRI device 400 so as to obtain DW-MRI data (step 560).

For convenience in discussion, the axial space has been divided into specific regions or zones of comparable characteristics. However, each axial direction may be considered separately and the appropriate value of b, TE or N computed and used for obtaining the DW-MRI data. In addition, it may be possible to use non-uniformly distributed angular directions so as to take advantage of the non-uniform properties of the b value which may be obtained when all three gradient axis coils are energized.

While the methods disclosed herein have been described and shown with reference to particular steps performed in a particular order, it will be understood that these steps may be combined, sub-divided, or reordered to from an equivalent method without departing from the teachings of the present invention. Accordingly, unless specifically indicated herein, the order and grouping of steps is not a limitation of the present invention.

Although only a few exemplary embodiments of this invention have been described in detail above, those skilled in the art will readily appreciate that many modifications are possible in the exemplary embodiments without materially departing from the novel teachings and advantages of the invention. Accordingly, all such modifications are intended to be included within the scope of this invention as defined in the following claims.

What is claimed is:

1. A method of measuring a diffusion tensor, the method comprising:
    selecting a plurality of axial directions, for which diffusion weighted magnetic resonance imaging (DW-MRI) data are to be generated;
    grouping the plurality of axial directions spatially into at least three groups;
    selecting an echo image time (TE), a gradient b-value, or the TE and the gradient b-value to be a different value in each group of the at least three groups;
    operating a magnetic resonance imaging (MRI) device to obtain the DW-MRI data; and
    measuring the diffusion tensor based on the obtained DW-MRI data.

2. The method of claim 1, wherein a number of data sets to be averaged for an axial direction of the plurality of axial direction in each group of the at least three groups is selected to achieve a specified signal-to-noise (SNR) ratio.

3. The method of claim 1, wherein the gradient b-value is a fixed value, and a value of the TE varies depending on the group of the at least three groups.

4. The method of claim 3, wherein the value of the TE is constant within the group.

5. The method of claim 1, wherein a value of the TE is a fixed value, and the gradient b-value varies depending on the group of the at least three groups.

6. The method of claim 5, wherein a gradient b-value along a principal axis of the MRI device is less than a maximum value of a gradient b-value along the principal axis of the MRI device.

7. The method of claim 5, wherein the gradient b-value is constant within the group.

8. A magnetic resonance imaging (MRI) device comprising:
    a main magnetic field coil;
    three gradient magnetic field coils;
    a radio-frequency (RF) transmit-receive unit; and
    a control computer configured to operate the MRI device to collect data for measuring a diffusion tensor of a voxel by measuring T2-weighted images with a diffusion gradient applied along a plurality of axial measurement directions,
    wherein the plurality of axial measurement directions is assigned to three groups, and
    wherein a b-value is maintained constant, and a value of echo image time (TE) is varied from group-to-group of the three groups.

9. The device of claim 8, wherein the b-value is determined by computing a Stejskal-Tanner equation.

10. The device of claim 8, wherein the control computer is configured to obtain a T2-weighted image in each group of the three groups with the b-value approximately zero.

11. The device of claim 10, wherein the control computer is configured to use the T2-weighted image with the b-value of approximately zero to normalize data taken with b-values higher than zero for each voxel.

12. The device of claim 8, wherein the b-value is in a range of about 0 s/mm$^2$ to about 10,000 s/mm$^2$.

13. The device of claim 12, wherein the b-value is in a range of about 500 s/mm$^2$ to about 2,000 s/mm$^2$.

14. A computer program product, stored on a non-transitory computer readable media, comprising instructions for configuring a computer associated with a magnetic resonance imaging device to:
    obtain a diffusion-weighted magnetic resonance imaging (DW-MRI) data for a voxel along a plurality of axial directions using the magnetic resonance device, wherein the plurality of axial directions is spatially segmented into at least three groups, and a value of an echo image time (TE), a b-value, or the value of the TE and the b-value is a different value in each group of the at least three groups.

15. The computer product of claim 14, wherein the computer is configured to:
    obtain DW-MRI data for a plurality of voxels, the plurality of voxels including the voxel; and
    analyze the DW-MRI data for the plurality of voxels to determine a diffusion tensor for the voxel of the plurality of voxels.

16. A computer program product, stored on a non-transitory computer readable media, comprising instructions for configuring a first computer to:
    select an orientation of a plurality of axial directions;
    form at least three groups of axial directions from the plurality of axial directions, wherein axial directions of each group of the at least three groups have a similarity of orientation relationship to three orthogonal axes;
    accept information characterizing a gradient amplifier and coil properties of a magnetic resonance imaging (MRI) device, a T2 value of tissue to be imaged, and a signal-to-noise ratio to be achieved;
    compute a combination of a T2 value, a b-value and a number of measurements for each group of the at least three groups so that a total number of measurements is reduced when compared with a constant value of T2 and the b-value; and
    transmit the computed T2 value, the computed b-value, and the at least three groups of axial directions to a second computer for controlling the operation of the MRI device.

17. The computer program product of claim 16, wherein the axial directions are substantially uniformly distributed in angular space.

18. The computer program product of claim 16, wherein the first computer and the second computer are the same computer.

19. The computer program product of claim 16, wherein the computed T2 values, the computed b-values, and the computed number of measurements are stored in a non-volatile storage medium of the first computer, the second computer, or the first computer and the second computer such that the MRI device is operatable without re-computing the T2 values, the b-values and the number of measurements.

20. The computer program product of claim 19, wherein the non-volatile storage medium is the non-transitory computer readable media.

21. A magnetic resonance imaging (MRI) device comprising:
    a main magnetic field coil;
    three gradient magnetic field coils;
    a radio-frequency (RF) transmit-receive unit; and
    a control computer configured to operate the MRI device to collect data for measuring a diffusion tensor of a voxel by measuring T2-weighted images with a diffusion gradient applied along a plurality of axial measurement directions, wherein the plurality of axial measurement directions is assigned to three groups, and a b-value, a value of echo image time (TE), or the b-value and the value of TE is varied from group to group of the three groups, wherein the control computer is configured to obtain a T2-weighted image in each group of the three groups with the b-value approximately zero, and wherein the control computer is configured to use the T2-weighted image with the b-value of approximately zero to normalize date taken with b-values higher than zero for each voxel.

22. The device of claim 21, wherein the value of TE is maintained constant, and the b-value is varied from group-to-group of the three groups.

23. The device of claim 22, wherein the b-value is largest in a group of axial measurement directions of the three groups centered on an angular direction approximately equidistant from each principal magnetic axis of the magnetic resonance device.

* * * * *